United States Patent
Martini

(10) Patent No.: US 8,498,114 B2
(45) Date of Patent: Jul. 30, 2013

(54) ENERGY SAVING SYSTEM AND METHOD FOR COOLING COMPUTER DATA CENTER AND TELECOM EQUIPMENT

(76) Inventor: Valan R. Martini, Alpharetta, GA (US)

(*) Notice: Subject to any disclaimer, the term of this patent is extended or adjusted under 35 U.S.C. 154(b) by 78 days.

(21) Appl. No.: 12/304,534

(22) PCT Filed: Jun. 15, 2007

(86) PCT No.: PCT/US2007/071313
§ 371 (c)(1),
(2), (4) Date: Dec. 12, 2008

(87) PCT Pub. No.: WO2008/127344
PCT Pub. Date: Oct. 23, 2008

(65) Prior Publication Data
US 2009/0168345 A1 Jul. 2, 2009

Related U.S. Application Data

(60) Provisional application No. 60/804,908, filed on Jun. 15, 2006.

(51) Int. Cl.
*H05K 7/20* (2006.01)
*H05K 5/00* (2006.01)
*F25D 17/06* (2006.01)

(52) U.S. Cl.
USPC ........ 361/695; 361/696; 361/679.5; 454/184; 62/180; 62/259.2; 62/414

(58) Field of Classification Search
USPC .. 361/695, 696; 62/180, 259.2, 414; 454/256, 454/184
See application file for complete search history.

(56) References Cited

U.S. PATENT DOCUMENTS

| | | | |
|---|---|---|---|
| 6,034,873 A * | 3/2000 | Ståhl et al. | 361/701 |
| 6,672,955 B2 * | 1/2004 | Charron | 454/184 |
| 6,834,512 B2 | 12/2004 | Bash et al. | |
| 6,859,366 B2 | 2/2005 | Fink | |
| 6,980,433 B2 | 12/2005 | Fink | |
| 7,112,131 B2 | 9/2006 | Rasmussen et al. | |
| 7,278,273 B1 * | 10/2007 | Whitted et al. | 62/259.2 |
| 7,568,360 B1 * | 8/2009 | Bash et al. | 62/186 |
| 7,903,407 B2 * | 3/2011 | Matsushima et al. | 361/695 |
| 2002/0131242 A1 * | 9/2002 | Nagasawa | 361/727 |
| 2004/0099778 A1 * | 5/2004 | Hogan | 248/261 |
| 2004/0184232 A1 | 9/2004 | Fink | |

(Continued)

OTHER PUBLICATIONS

International Search Report of International Application No. PCT/US2007/071313; Jul. 24, 2008; 1 pg.
International Preliminary Examination Report of International Application No. PCT/US2007/071313; Jul. 22, 2009; 8 pgs.

*Primary Examiner* — Zachary M Pape
(74) *Attorney, Agent, or Firm* — Gardner Groff Greenwald & Villanueva, PC

(57) ABSTRACT

A system and method of reducing consumption of electricity used to cool electronic computer data center, networking, and telecommunications equipment, and to reduce the incidence of thermal failure of electronic components, includes provision of one or more partitions to reduce the volume of the cooled environment supplying coldest possible cooled air from air conditioning systems to a chamber adjacent to the cooling air intake side of electronic components, preventing dilution of the supplied cooling airflow by warmer air from outside of the reduced volume environment, and controlling the delivery of cooling air flow through the reduced volume of the cooled environment.

25 Claims, 7 Drawing Sheets

U.S. PATENT DOCUMENTS

| | | | |
|---|---|---|---|
| 2004/0218355 A1* | 11/2004 | Bash et al. | 361/690 |
| 2004/0257766 A1* | 12/2004 | Rasmussen et al. | 361/689 |
| 2005/0193761 A1 | 9/2005 | Vogel et al. | |
| 2005/0237716 A1* | 10/2005 | Chu et al. | 361/696 |
| 2006/0260338 A1 | 11/2006 | Vangilder et al. | |
| 2012/0006038 A1* | 1/2012 | Sharma et al. | 62/97 |

* cited by examiner

ENERGY SAVING SYSTEM AND METHOD FOR COOLING COMPUTER DATA CENTER AND TELECOM EQUIPMENT

CROSS-REFERENCE TO RELATED APPLICATION

This application claims priority benefit to U.S. Provisional Patent Application Ser. No. 60/804,908, filed Jun. 15, 2006, which application is hereby incorporated herein by reference in its entirety.

TECHNICAL FIELD

The present invention relates generally to an energy saving system and method for reducing electricity used to cool computer data center and telecom equipment by reducing the volume of the cooled environment, controlling airflow, and preventing dilution of the cooling air by warmer air from outside of the cooled environment, and thus increasing cooling airflow, to prevent thermal failure of electronic components.

BACKGROUND OF THE INVENTION

Effective cooling of data centers and other facilities operating telecommunications or computer equipment is a growing field of endeavor. Electronic components that operate on the flow of electricity create heat in the process of utilizing electrical flow. Modern electronic equipment is fast and powerful, but generally consumes substantially more power than systems of only a few years ago, and therefore creates more heat in operation. Increased power consumption creates an increased need for cooling with regard to electronic equipment. Electrical consumption and associated costs are skyrocketing, and many facilities are experiencing problems in sourcing sufficient power required to cool modern electronic components as is needed to prevent thermal damage to the equipment.

Cooling systems often utilize a water tower, or compressor type systems, or other sealed systems to create chill. This may be transferred into the air of the environment where electronic equipment is operating by means of heat exchangers in a closed loop system with either glycol or water, or by supply from the compressor. Air handlers are usually placed directly in the computer environment and are positioned in what are thought to be strategic locations. Air handler systems are also utilized as the primary air filtration device to remove airborne contaminants. A common practice has been to locate air handler units near electronic equipment that produce the most heat within the controlled environment. The purpose is to ensure plentiful cooling air is delivered to cool the equipment with highest heat output. The air conditioning units in that environment are commonly referred to as "air handlers". Various systems have been proposed for cooling of computer and telecommunications equipment. For example, U.S. Pat. No. 7,112,131 to Rasmussen et al, U.S. Pat. No. 6,859,366 to Fink, U.S. Patent App. Pub. No. US2006/0260338 to VanGilder et al, U.S. Patent App. Pub. No. US2005/0237716 to Chu et al, and U.S. Patent App. Pub. No. US2005/0193761 to Vogel et al, are directed to various methods and systems having been proposed, all of which are hereby incorporated herein for reference.

In the modern world, medical records, governments, education, communications, transportation, banking, and all manner of other businesses have become increasingly dependent on computer equipment to communicate, and to process and store vital data. Many companies need to upgrade to modern equipment that is faster and more reliable in order to meet increasing information and communication demands. The United States Department of Energy estimates that Data Centers and Communication Centers currently account for about 2% of the total electrical power consumed in the USA. The report states that 45-billion kilowatt-hours of electrical energy were utilized in the USA to operate computer data centers during 2005. The cost of that energy exceeded $2.7-billion dollars for electrical energy utilized by data centers. Energy costs are rising, and energy utilized by communications and data centers is expected to increase exponentially as equipment becomes more compact and powerful, and as the reliance on electronic systems increases. Construction planning estimates indicate that total square footage of facilities utilized to house and operate data and communications equipment will quadruple within the next ten years. With faster equipment and miniaturization continuing, more power consuming equipment can be installed in a given space. Power requirements to operate newer electronic equipment have increased exponentially over requirements for equipment of only a few years ago. As a result of these changes, a new problem has surfaced, one that did not exist even five years ago. Many facilities are now finding that with the increased development in surrounding areas, and due to their own power requirements, that their facilities are already utilizing 100% of the electrical power that the facility power systems are capable of handling and/or that is available to the facility from the electrical utility. Problems related to electrical power shortages are becoming increasingly common. The situation has become the focus of most industry publications and information forums such as the Uptime Institute. Each new generation of equipment is faster, and each requires more power. With components being made smaller and smaller, more heat generating equipment can be installed in a given area. This has resulted in a massive increase in electricity consumption by facilities that were built with consideration and infrastructure support designed for electronic equipment that consumes less power. The increased density and speed of newer electronic equipment creates increasingly more heat, resulting in the need for increased cooling capacity to prevent thermal failure of the electronic equipment. The electricity required for cooling electronic data and telecommunications equipment can consume as much as half of the total electrical power utilized at facilities operating modern equipment. Many facilities simply do not have the power distribution infrastructure to obtain enough electricity nor adequate cooling efficiency to meet the increased heat output of new electronic equipment.

Older facilities are often unable to safely distribute sufficient electricity through existing electrical wiring systems in their buildings. Retrofit to meet the demand required by modern communication and data processing equipment is simply not possible without having to take the equipment offline. Having adequate power and distribution capabilities within the facility is not a total solution. If the cooling is inefficiently or ineffectively provided to the equipment, thermal failure of expensive components can result in communications and business interruption. Many organizations operating data center facilities are now forced to make a choice between retrofitting their existing facility (which may not even be possible), or moving to a newer facility that is better designed to enable use of modern electronic equipment, or finally to outsource their entire data center operations. Moving operations from one telecommunications or data center facility to another is very expensive. Operators of such facilities may perceive that there are no other options that will enable them to take advantage of utilizing the newer faster equipment. As a result of the huge initial investment involved, many companies are forced to outsource the housing and operation of their data and telecommunications systems to a third party company. This has often proven to be of no benefit since the outsource company may suffer from the same disadvantages and inadequacies as the companies that they serve.

Companies that offer data center facility space and infrastructure systems to other companies are referred to as "co-locations" wherein many companies may place equipment, or lease equipment owned by the co-location company. The co-location company is responsible to ensure necessary infrastructure systems are available including abundant electrical power, backup power systems, a clean operating environment, security, fire control, and necessary cooling to appropriately cool heat producing electrical equipment. After the catastrophe of Sep. 11, 2001 in which the New York Trade Center buildings were destroyed, the economic impact of the situation spread to include the loss of vital data. As a result, the United States government instituted a series of regulations under the Federal Information Security Management Act (FISMA). It was designed to ensure that vital information affecting the economy and national security were well protected, and that vital data such as Stock Exchange data, transportation data such as air traffic control systems, banking data, medical data, and other critically vital info are available at all times. This lead to construction of many new data center facilities. The fact that electronic equipment will eventually fail demanded the need for backup systems that are often located in other facilities and which are often located in other parts of the Country to ensure that the vital data would be available even in the event of a catastrophe at any one or more of their facilities. Backup systems within the same facility as the primary systems could be rendered useless at the same time in the event of a catastrophe such as a flood or fire. The need for redundancy has led to the need for more data centers, and businesses now have to sponsor multiple data center facilities to ensure that critical communications and data availability are uninterrupted. Suddenly, to ensure that the vital information available, there became a need for individual companies to operate two, three, four, or more data centers at a tremendous cost, and huge increase in energy demand. Industry journals document the fact that many companies in fact must move their telecommunications and data center operations in order to obtain a basis for consistent system reliability and access to vital communications and data. Further legislation enacted as a component of the Homeland Security may require costly modification of existing operational procedures or facilities, as a result of increased concerns about data security and availability. Building a new facility may take years. Uptime and system reliability can disappear in an instant if a catastrophe occurs, cutting off vital communications and data accessibility, at any time and without warning. Moving to a new facility, or switching over to new equipment is a process called "migration". It is a slow, arduous process that may in itself cause system outages in which vital data could be lost. Unable to tolerate down time for any reason, companies were forced to create and operate multiple data center sites, or to outsource their data and communication requirements.

Modern data centers can cost upwards of $1000 per square foot to develop and build. Special site preparation, establishing a controlled environment envelope, special air quality control systems, security controls, specialized power distribution, customized cable layouts and links to networks and telecommunications ports are all required. Sometimes an access flooring system is installed, while at other facilities, equipment may be placed directly on the structural floor with wiring placement located overhead. That is the shell of a data center facility. Added to this are special cooling systems, filtration, backup power, and miles of cabling and/or fiber optics. Fire suppression and warning and control systems must be installed, as well as other disaster controls such as fluid leak detection sensors and controls, emergency cooling, and even seismic bracing is required in some regions and tall buildings. Facilities operating modern electronic systems may contain equipment valued at $2,000,000 or more for every 1,000 square feet of telecommunications or data center floor space. Thus, the cost to provide floor space in a modern specialized facility may exceed $10,000 for the floor space required to install each rack of electronic equipment. If the racks cannot be completely populated with equipment, the cost of floor space per rack can exceed $20,000 per rack.

Beyond the huge cost to construct the facility and populate it with electronic equipment and auxiliary power systems, most companies spend about 10% of the startup cost each year thereafter just to maintain the facility and keep equipment up to date and operational. The cost is indeed huge. If one were to ask any company what is the most valuable thing housed in their data center, they will typically answer that it is not the building, nor in the computers, networking, or telecommunications equipment. Rather, the most valuable thing is the communications capability provided by the equipment, and the data that is processed and stored within the electronic equipment. Modern society has become an information dependent society in virtually every aspect of communications, commerce, government and transportation. Data center industry journals are indicating a there will likely be a 400% increase in constructed data center square footage over the next ten years. Companies and institutions are making huge investment toward assuring communication access and to have their vital data information available at all times.

Once the facility is built, there is simply no absolutely effective way to ensure that all of the communications systems, network systems and all of the data equipment will operate effectively and be available 100% of the time. Many companies now must have information availability 24-hours a day, 7-days a week, 365-days per year, year after year. Toward the end of assuring data or communications availability, companies are left with no choice but to build multiple data centers operating concurrently which support the same dataset, just in case something happens that would otherwise interrupt the systems operation at one or more of the facilities. Government agencies and large businesses such as Microsoft, Google, EBAY, General Electric, NASA, Bank of America, etc. have mission critical information or communications requirements, and must sponsor and maintain multiple facilities at a cost of many hundreds of millions of dollars each. The problem is even more expensive for global enterprises operating telecommunications and data center facilities in other Countries.

Redundant telecommunications, networking, and data processing and storage electronic systems are often required to maintain operations in the event of an outage or disaster. A single facility may have 2, 3, 4, or even 5 unique sources of electrical power. Some are designed to be temporary, for emergency use. Others are viewed as primary sources, necessary to support long-term operation. Water for humidification control and cooling may be obtained from the city, while others may obtain groundwater, using the municipal utility as backup. Some companies are now generating their own electricity in the interest of becoming independent of the public utility or because the local utility company simply cannot consistently provide enough "clean" power to handle the load requirement during peak operational periods. Additionally, Federal Laws have been instituted to ensure that vital records are maintained. Protection of personal identity and health information is a key concern. Banking and transportation information are critical in the global economy. As an example, passenger manifests and immigrations and customs records must be constantly available and accessible around the world and in real time. New government regulations stipulate penalties for interruption of communications services or data availability outages if the data is necessary to interstate business, transportation, banking, security, medical, etc. Vital enterprises have vital data.

Thus it can be seen that continuing improvements to methods and systems for cooling computer data center and telecom equipment are desirable.

SUMMARY OF THE INVENTION

It is now known that merely locating discharge of cooling air from an air handler near heat producing electronic equipment does not necessarily ensure that the cooling air output is actually providing the desired cooling effect toward preventing thermal failure of the electronic equipment. Indeed, there is a considerable difference between discharging cold air near a heat source, and effectively cooling that heat source in the desired manner. For example, FIG. 1a shows the theoretical delivery of cooling air to computer equipment in a typical "hot aisle-cold aisle" arrangement; whereas FIG. 1b shows the mixing of cooling air with hot air prior to delivery, recirculation of hot air, and insufficient cooling especially at upper rack positions, which commonly occurs in actual practice using known systems and methods for cooling electronic equipment. The chilled air from the air handlers is often blown under an elevated floor with removable tiles. Access flooring tiles can be perforated (having holes drilled through them or other vent configuration) so that the cold air can escape to provide cooling to computers. Colder and damper air coming out of the perforated tiles is denser and otherwise heavier than the general air mass within the environment. Thermodynamics and gravity make the cooler air fall immediately to the floor, displacing warmer, less dense air. Often the air vented from the perforated floor tiles is vented as a plume that may never rise more than a few feet above the floor level. The electronic equipment cabinets that this air is supposed to cool can be up to 7-feet tall or more. Being heavier than the surrounding air, the cold air supplied by the air handler quickly sinks to the lowest elevation. Most controlled environment rooms soon become stratified, with a layer of excessively damp, much cooler air flowing along the lowest portion of the environment. The colder air layer does not reach the full height of racks containing heat producing electronic components. Warmer air is displaced and may begin to accumulate near the ceiling. Various layers of differing temperatures and humidity may develop causing differential temperature strata layers to be formed in various areas throughout the air mass in the environment.

Data centers typically may have one or more air handlers per 2,000 square feet of floor space. The need for more or less cooling equipment should obviously be determined by whether the air conditioning systems are able to properly to cool the amount of heat generated by electronic equipment operating in any area. Mathematical equations exist that are supposed to calculate Kilowatt Hours of electricity consumed by heat generating equipment and which are used to calculate the total BTU heat load. Ultimately the calculation is used to determine the total cooling requirement. Contrary to common thinking, the reality is that a larger controlled environment with relatively low population of electronic equipment require substantially more cooling due to the high volume of the environment causing poor turnover of the large air mass. Thus more air moving and chilling equipment is needed, and a greater volume of air must be maintained to acceptable condition by the air conditioning systems. This is a crucial factor to the economy and energy savings provided by the operational system and method of the present invention. The air handlers push huge volumes of air into the cooling air supply environment. Typical mid-sized air handler units are documented to produce flows of 12,000 cubic feet of airflow per minute or more. If an air handler is operating correctly, the output airflow should clean by filtration within the system, and then cooled. The airflow may also need to be re-humidified to replace moisture lost during the cooling process as condensation.

Perforated floor tiles may have any amount of output flow in distributing the chilled air from the air handlers to the top side of the floor where the heat producing equipment racks are located. Flow output may be positive or negative, that is flowing from or by suction, flowing into the subfloor environment. How well the cooling air is delivered from the subfloor environment to the above floor environment is determined by how well various infrastructure systems are utilized together. In some bad installations, warm air is sucked from the air mass above the access floor system into the cold air supply plenum below the access floor system. This result is caused by the venturi effect due to the high velocity of airflow under the access floor passing the holes in the perforated floor tile that are supposed to vent the air from below to above the floor system. Thus, locating high velocity air handlers too close to equipment can have a very negative effect on the cooling efficiency and cooling performance of the entire above floor environment. In general practice, perforated floor tiles have poor flow output. Most only have 200 to 300-feet per minute of flow rate, and each tile is 4 square feet, but only 30% open area, so 4-square feet×30%=1.2-square feet of actual flow area. Multiply the 200-feet per minute flow speed by the actual flow area of 1.2-feet=240-cubic feet of air per minute flowing through an average perforated tile. Optimal flow would be above 600 or more cubic feet per minute of flow per tile.

As a result of these factors, it has been found that most of the cold air generated by all the cooling equipment and chillers is wasted into the general environment, and never actually flows through the heat producing equipment. The cooling air is dispersed as it mixes with warmer air mass within the room at large, and thus the entire air mass obtains temperatures above the cooling air temperature generated by the air handlers. Most electronic equipment racks have low airflow volumes passing through the components within the equipment racks. Flow rates of less than 100-cubic feet of air per minute passing through all of the electronic components in a single equipment rack are common. The tiny fans on the equipment components and circuit boards don't add up to much flow due to the small diameter and other features of the axial fans used to create the airflow. New installation techniques involve installing equipment in very close proximity to other components in the rack, which is an efficient use of space and expensive floor space. However, the close proximity of the equipment further minimizes flow and adds to latent heat soak and heat retained by the heat producing equipment. Thus, these high-density installations are very prone to heat related failure as a result of the buildup of the heat within the rack enclosure. Other than the airflow created by the tiny fans, there may be very little or no airflow around the equipment inside the rack enclosures. Often, exhausted warm air flows to the front side cooling air intake vents of components due to suction created by the air drawn into the components by the tiny fans. This is the worst possible circumstance, wherein equipment is recirculating already warm exhausted air through cooling air intakes. Heat related electronic component failure has become a more common problem, especially at older facilities that may have older air conditioning methods or systems installed. If an older facility installs new electronic equipment, the heat produced can exceed the capacity of the facilities cooling systems. Design and configuration is also a factor in cooling efficiency and can greatly impact the amount of energy consumed to cool telecommunications or data center equipment. How space is utilized is crucial to optimizing cooling performance and maximizing uptime probability and system reliability.

As an example application to which the present invention may be directed, a typical computer environment will have rows of cabinets, each containing many computers or other components. The cabinets are often aligned adjacent to one another to form rows. Rows of enclosure cabinets may be located so that parallel fronts of two rows face each other to form an aisle. The floor space of the aisle formed by the facing equipment is often about 4-feet wide or less. There is no standard configuration, and so a useful cooling solution must be versatile in order to meet any possible configuration regardless of equipment location within the telecommunications or data center. Equipment may be moved to make way for new equipment installations or simply for reconfiguration. Upgrades and reconfiguration may be performed for security or even structural reasons, or simply to upgrade electronic systems. Relocating air handlers requires major planning since plumbing for water supply to provide humidification, and drainage from condensation are often required for placement of an air handler. Sometimes equipment is not positioned so that there is a forward facing row opposite, and thus forming an aisle front faces rear. In some instances, a computer cabinet (also called a rack, or an enclosure) may be a single unit existing independently or simply apart from any other equipment. For the purposes of expansion and upscale planning, companies often start out with open space, leaving room for more equipment to be installed as their communications and data requirements grow. Centers may take years to become fully utilized with regard to space. Other facilities are built and filled to capacity by the time the facility is ready to populate with equipment. In either case, day and night, year after year, the entire special volume of the facility is being cooled, and massive amounts of energy are wasted to generating cooling. Installation of new equipment can cause cooling and airflow circumstances to change as the location of the new equipment may vital airflow patterns. Every piece of equipment can become a barrier that changes the airflow patterns in the environment. If cabling is installed in the subfloor environment to connect to the new equipment, the airflow in the under floor environment changes also. Changes in configuration can have a devastating effect cooling performance and the cooling energy requirement. A meaningful cooling solution must therefore be capable correspondingly correcting any detrimental changes in the cooling provision.

Many facilities have access flooring systems installed, wherein the floor system bearing the weight of electronic equipment is supported above the structural floor by pedestals. Many facilities use the space beneath the access flooring system as a supply plenum to distribute airflow from air conditioning equipment throughout the environment. The access flooring system has removable panels. Some panels are solid, with no perforations. Others are perforated to allow for airflow from the subfloor environment. Perforated tiles are commonly located directly in front of the front airflow intake side of the cabinets containing electronic equipment. Some equipment enclosures have doors with perforation to allow airflow to flow through. It is commonly believed that cooling air flowing from perforated floor tiles located in front of equipment racks is pulled through the various heat producing components that have fans in them. Warmed cooling air is then expelled out the back of the cabinet by the cooling fans within the electronic components. Cooling airflow velocity and volume flowing through the equipment enclosures and individual components are often very low. Often the cooling airflow at the front side of equipment is almost imperceptible and may only be detected by the use of airflow meters. Often the area where warmed cooling air is exhausted from the equipment is considerably warmer than the cooling air being distributed from the perforated floor tiles. This is especially true when many cabinets aligned into rows with the exhaust sides facing. Frequently, the rear sides of cabinets are also aligned parallel and opposite to form an aisle wide enough to allow for workers to move equipment into the area. This positioning method creates what is commonly referred to as a "hot aisle". Data center designers call this systematic row style arrangement "Hot-aisle/Cold-aisle" configuration (see FIG. 1a). The differential in temperature between cooling air exiting the perforated tiles and the above floor environment can cause a most undesirable circumstance. It is now understood that rather than being lofted in the cold aisle to cool the equipment, the colder, denser, and more humid air exiting the perforated tiles is heavier than the warm air in the above floor environment air mass. As a result of gravity, the cooling air flowing from perforated floor tiles falls to the floor and flows uselessly out the end of the aisle between the rows. The air passing through the perforated tile causes turbulence in the above floor environment. Since the air is not partitioned once it is released above the floor, it is possible for the air to mix with the total volume of air within the above floor environment at large. This has been found to be a problem in all facilities using down-flow and up-flow air handlers, and in facilities with equipment positioned on access flooring systems and those in which equipment is placed directly on the structural floor. The problem increases when the differential between the above floor air mass and the below floor air mass temperatures increases. An object in motion tends to remain in motion. Cooling air flowing to the above floor air mass is drawn back to the air handler systems without ever passing a through electronic equipment to provide efficient cooling. Airflow provided by the air handlers not flowing from perforated floor tiles in a manner that will allow for appropriate cooling of upper portions of the racks containing electronic equipment. It is now known that this condition can result in a circumstance where exhausted from the backside of the electronic equipment, while in motion, is often circulated over or around the equipment to be ingested back into the front of the cabinet. (see FIG. 1b). As a result, it is not uncommon for the electronic components located at the end of rows or at the top portion of equipment racks to be the most susceptible to heat related failure. A corrective solution must prevent this recirculation from occurring and must ensure than only coldest possible air is delivered in high flow volumes to all components in each rack, regardless of location within the environment, and regardless of position or facing orientation in relation to other equipment racks. A meaningful and economical solution must also be versatile enough to allow for reconfiguration without reinvestment, and without requirement for any particular initial configuration, brand of equipment, and size of equipment, including deployment where equipment of differential heights and depths is aligned in the same row. A versatile solution would allow for installation without interrupting operations of the facility, and would not necessitate relocating system components to be utilized. A desirably versatile solution must also be capable of providing the similarly effective performance results, regardless of whether or not a facility has an access floor system installed. A versatile solution must be capable of providing similarly high volume cooling airflow at the coldest possible temperature from any individual or combination of air handler delivery methods, and would be capable of providing increased airflow volume from any single or combination of air handler positions in relation to the equipment racks including below, above, or beside the electronic equipment.

Much of the work by technicians is performed on what is commonly referred to as the back side of the equipment where cooling airflow is exhausted. If the equipment is located in the hot aisle configuration, this can often a very uncomfortable place to work as a result of the temperature in this area. Air moving slowly through the server cabinets also exits slowly. Many equipment racks may have a total flow rate of less than 70-cubic feet per minute flowing through the components mounted within the rack. In addition, the cabinet itself can act as a "hot box" by prohibiting radiant heat from effectively dissipating from each electronic component chassis. Working behind cabinets in the hot aisle is like working in front of a radiant heater. Slow and low volume airflow through the equipment racks has been found to cause the heat generated within the enclosure to gradually heat up surfaces that would otherwise remain cooler if the equipment were not installed in the cabinet. This results in a condition where the latent heat distributed throughout the rack represents a heat load that is actually higher than the actual generated heat load at any point in time by the components. As a result of the increased temperature within the cabinets, air handlers are often set to operate at lower temperatures to offset the latent heat buildup within components and enclosures. This latent heat buildup often precedes thermal component failure. An energy efficient solution must be capable of provide a higher volume of airflow and must provide cooling airflow to electronic component surfaces that are not located in the path of the cooling airflow stream generated by the small fans in the components. Since all surfaces in the cooling airflow might then dissipate heat, the operating temperatures of heat producing components would be lowered, resulting in more efficient cooling by preventing latent heat retention from increasing the cooling requirement. The output air temperature created by the air handlers might then be raised, thus saving considerable energy. An energy saving cooling solution such as this would utilize increased flow volume through heat producing components to provide adequate cooling rather than the commonly utilized method of creating colder airflow from air handler systems.

A data center air handler may generate chilled air output at temperatures ranging from 40 to 60-degrees Fahrenheit depending on the circumstances of the particular installation. In facilities with access flooring systems, it is commonly believed that the cooling airflow created by the air handler is ducted by means of the subfloor plenum to the various perforated tiles for delivery to the electronic equipment. However, some openings are commonly present in most access floor systems that result in undesirable leaks where floor tiles may be incorrectly positioned, or where the tiles have been cut to make room for wires to be passed from the sub-floor to the above-floor environment. It is not uncommon to have holes cut into floor tiles so that wires can be fed through to the electronic equipment in the cabinets on top of the access flooring system. The holes are commonly considerably larger than the wires and therefore cooling air leaks undesirably from the subfloor plenum. As a result, air pressure and flow provided to the perforated tiles can be severely reduced. This is a commonly observed problem in many facilities today. As the cooling airflow passes through the subfloor plenum, the air may pick up heat from warm floor surfaces where heat-generating equipment is positioned on the floor above. There may also heat transfer from a floor below in multi-story buildings. Sometimes leaks in the perimeter walls of the room containing the electronic equipment. Often, the controlled environment room is found to have lower air pressure than the peripheral and ambient areas causing contaminating airflow into the environment under doors, though drains, and other flow paths. As a result, cooling airflow delivered to perforated floor tiles is often warmer than the air generated by the air handlers. If an air handler is generating cooling airflow at 52 to 55-degrees Fahrenheit, by the time it exits the perforated tiles it may often be 58-degrees Fahrenheit or more. The air temperature one foot above a perforated floor tile may be 3 or 4-degrees warmer than the temperature of the cooling air flowing through the perforated tile, for example 61-degrees Fahrenheit. At an elevation of three feet above the perforated floor the temperature may be an additional 3 or 4-degrees warmer, for example 65-degrees Fahrenheit. Six feet above the perforated tile, the temperature is commonly above 70-degrees Fahrenheit. The average temperature of the common air mass in the above floor environment is often 72-degrees Fahrenheit. This is often found to be the temperature of cooling air that flows into the cooling air intakes of the electronic equipment. As a result of increasing heat related component failures, this previously known delivery method has proven to be very inefficient and does not ensure that the coldest possible cooling air that is generated by the air handlers is actually delivered to the flow through the heat producing electronic equipment. The existing method does not provide cooling airflow through heat producing equipment without the cold air flowing from perforated tiles first mixing with warmer air common to the above floor air mass. In addition, the commonly utilized cooling method does not prevent considerable undesirable loss of cooling airflow volume along the flow path from air handlers.

Telecom and data center facilities will have a common above floor air mass temperature of 72-degrees Fahrenheit. The air handler intakes are receiving air from the common air mass, in most circumstances, at the same temperature as the common air mass in the above floor environment. Data center environments are typically configured to have a relative humidity in the above floor environment that is above 40% relative humidity, but below 55% relative humidity. It is very common to find that the relative humidity in the above floor air mass averages 50% relative humidity. As the air is passes through the heat exchanger cooling section of air handlers, the air may release moisture in the form of condensation that is usually disposed of by capturing the liquid in a drip pan which discharges to a drain. In order to provide a consistent relative humidity within the above floor air mass, the water lost from the cooling airflow due to condensation must be replaced. Additional humidification is often provided by means of a humidifier section within the air handlers. The humidifier section may utilize high-energy lamps or other heating methods to heat water to evaporate from a humidification tray that is often supplied with water from the general utility, and sometimes from a well. This cycle of dehumidification and re-humidification is a wasteful result of the wide temperature differential, or Delta-T, between air handler intake and output air temperatures. The humidification process requires large quantities of electrical power. Over months and years, the power consumed is enormous. A more economical system would reduce the amount of humidification required by reducing the differential in air handler input and output temperatures. The need for humidification is reduced correspondingly as the differential in air handler input and output temperatures are reduced. The corresponding reduction in humidification requirement would result in substantial energy savings.

The flow path of the cooling airflow vented from the perforated tile is random in most facilities. As a result, the cooling air eventually mixes the warmer air in the above-floor environment air mass. In a typical data center, this environment is maintained at 70 to 72-degrees Fahrenheit. Assuming this as an average temperature model, one must calculate that the heat producing electronic components are ingesting 72-degree Fahrenheit air for cooling. A typical data center room has 12 to 24-inches of height in the subfloor plenum. There may be 10 feet or more of above floor height to the ceiling partition or structural ceiling. In many facilities, this represents a large cubic volume of air mass. Both the subfloor and the above floor air masses are utilized to provide cooling airflow to the equipment. The entire room or facility serves as a cooling air supply plenum in most communication and data centers. For example, a 200-foot long by 200-foot wide controlled environment room has 40,000 square feet of floor area. If the ceiling partition were 13-feet higher than the structural floor, the facility would have a total air mass volume of more than 500,000 cubic feet. Often, one air handler is installed for every 1500 to 2,000-square feet of floor space, this would mean that there are a minimum of 20 air handlers to provide cooling airflow. Documentation shows that typical large facility air handler units are able to generate an average flow volume of 12,000-cubic feet per minute into the subfloor plenum environment when the equipment is operating correctly. If 20 typical air handlers operating at the same time to supply cooling air to the same environment, this would mean that a typical total of 240,000 cubic feet of cooling airflow is generated by all of the air handlers each minute. A facility of this size might have many racks of equipment installed. When the actual volume of air flowing through all of the heat generating electronic components is measured, it may be found to be less than 20,000 cubic feet per minute, meaning that actual cooling potential is less than 10% of the coldest air flow volume generated by the air handlers. The average temperature at the intake of the racks is 72 degrees. The temperature of cooling air flowing into heat generating equipment intakes is often found to be at or very nearly equivalent to the temperature of air being drawn into the air handler intakes. This means that the cooling temperature created by the air handlers is in large part lost due to mixing of the cooling airflow with warmer air. An energy saving solution should be capable ensuring that the cooling airflow is delivered at or substantially near to the temperature of air flowing out of existing room air handlers. None of the currently available cooling solutions ensure that this is done. To maximize cooling efficiency, an energy saving solution would ensure that the high volume of airflow created by air handlers is channeled directly to the heat producing electronic equipment without loss of pressure or volume through leaks in the floor system, and would maximize cooling results by providing high volume airflow through and also around surfaces of heat producing components in a flow path other than those surfaces located within the flow path generated by the cooling fans within the electronic components.

In one aspect, a representative embodiment of the present invention provides an energy saving method of reducing the consumption of electricity used to cool computer data center and communications equipment, the method including reducing the volume of the cooled environment, and controlling the cooling air flow through the reduced volume of the cooled environment.

In another aspect, a representative embodiment of the invention is a system for reducing the consumption of electricity used to cool computer data center and telecom equipment. The system preferably includes at least one partition for defining a reduced-volume cooled environment surrounding the equipment, and means for controlling the cooling airflow through the reduced-volume cooled environment.

In another aspect, the invention is a cooling system for electronic equipment, the system preferably including a substantially airtight enclosure for delivering cooling air to at least one electronic component, means for delivering cooling air to the substantially airtight enclosure, and means for controlling the flow of the cooling air to the at least one electronic component within the substantially airtight enclosure.

In still another aspect, the invention is a cooling system for electronic equipment. The cooling system preferably includes an enclosure defining a reduced-volume interior cooled environment for delivering cooling air to the electronic equipment and substantially inhibiting mixing of external air with the cooling air. The cooling system preferably also includes means for controlling the delivery of the cooling air through the reduced-volume cooled environment.

In another aspect, the invention is a method of reducing the consumption of energy used to cool electronic equipment. The method preferably includes the steps of providing an enclosure defining a reduced volume cooled environment, delivering cooling air to the reduced volume cooled environment, generating a pressure differential from a first side of the electronic equipment to a second side of the electronic equipment to create a flow of the cooling air across a surface of the electronic equipment, and controlling the delivery of cooling air from the reduced volume cooled environment to the electronic component.

In representative embodiments, the system and method of the present invention provide improved efficiency of energy use and provide vital cooling to mission-critical data center computer systems and telecommunications and networking equipment that produce heat as a result of electrical power utilization. Example embodiments of the invention may also function as a security system, by limiting physical proximate access to classified information systems. Example embodiments of the invention can also act to suppress noise by greatly reducing the noise level created by all the equipment and airflow noise common to environments where the invention might be utilized.

Further representative embodiments of the invention can be utilized to provide stability bracing for tall, heavy equipment cabinets utilized in computer rooms that might be located in facilities where motion could cause equipment to move and potentially topple. Examples of installations where the embodiment may be utilized for this purpose may include, but are not limited to, data centers located in regions with seismic activity where earthquakes may cause potential motion, or where computer equipment is located in ocean-going ships such as navy vessels, or aircraft with computer systems such as hurricane research or surveillance aircraft.

Example embodiments of the invention may also serve to provide fluid delivery by means of delivering compressed gas liquid such as nitrogen or any gas that does not represent an inhalant hazard, and which can be vaporized prior to release, causing chill by evaporation so that consistent and high volume flow of fluid at any temperature desired for cooling of electronic equipment is assured, and in quantities sufficient to maintain any desired temperature for continuous operation of heat generating electronic equipment requiring constant cooling to prevent thermal failure. Example embodiments of the invention can also serve as a fire control system, by serving as a partition to limit the spread of flames in the event of a fire.

Example embodiments of the invention can utilize delivery of an extinguishing fluid such as nitrogen, FM-200 or other material that preferably does not represent an inhalant hazard, and which may or may not be vaporized prior to release, and which gas may serve as a fire suppression fluid so that a fire can be extinguished. Representative forms of the invention may utilize an appropriate gas for this purpose, such that, the extinguishing component, such as nitrogen, will not itself contaminate the environment with particulate from the suppression method, nor will any fluids be dispensed which may damage equipment by corrosion or electrical shorting which may otherwise pose a risk to emergency response personnel or electronics system technicians. In addition, there are no extreme human health hazards of inhaling concentrations of vaporized nitrogen into an otherwise air atmosphere since the mixture of gases in air is already mostly nitrogen.

Example embodiments of the invention also provide contamination control to prevent airborne soil from being deposited on sensitive electronic equipment that is prone to failure as a result of contamination. The invention prevents air from unknown or undesirable sources from flowing through the electronic equipment. Preferred forms of the invention only allow desirably clean air of appropriately controlled temperature and humidity to flow to through the electronic equipment from the air conditioning systems which are designed to provide high flow volumes of appropriately filtered, humidified air at a desired temperature.

Additionally, example embodiments of the invention minimize the volume of air that requires cooling conditioning, and at the same time increases the amount airflow that is cooling the electronic equipment. The increased flow will preferably prevent debris from any source from settling inside of the electronic equipment, thus further minimizing the potential for system failure due to contamination related shorting or agglomeration of debris inside of sensitive equipment. Agglomeration can cause debris to clump together to form large, often electrically conductive debris formations that can be ingested into computer cooling fans, ruining flow efficiency, or worse, obstructing the fan to the point that motion of the fan stops. Eliminating the agglomeration of debris can reduce the potential for electrical shorting and insulation of heat yielding components.

Example embodiments of the invention optimize the utilization of very costly real estate and construction costs associated with architecting specialized data center and telecommunications facilities having critical environment areas where mission critical equipment is housed for operation. Modern electronic equipment produces much more heat than older systems. Currently, computer systems utilize 20 or 30 times the energy of systems that were state of the art only three or four years ago. These systems produce considerably more heat as a result of the power consumption. The new systems produce much heat, that companies are finding it difficult to prevent thermally related failure of systems using air as the cooling fluid. The electricity consumed in cooling is a large portion of the overall electrical energy utilized by such facilities. Electricity required for cooling will be drastically reduced by the systems and methods of the present invention, to increase the overall cooling performance of existing air conditioning systems.

Cooling is proving to be a major problem as a result of stratification in the atmosphere in computer environments separating into various levels, and therefore, not providing consistent cooling. With hotter air rising due to displacement by denser, cooler air, the uppermost portions of equipment cabinets often do not have airflow of sufficiently low temperature to provide cooling, and so the top portions of equipment enclosures are often left empty. This means that more cabinets, and thus more data center square footage are required to provide space adequate to house all of the computers that may be required for the operational processes of the facility. Example embodiments of the present invention eliminate stratification of the cooling air, and at the same time, prevent dilution of the coldest possible air supply by mixing with warmer air from undesirable sources. By eliminating mixing and stratification, and supplying the coldest possible airflow at a uniform temperature to all altitudes in the equipment enclosures, adequate cooling can be provided so that the enclosures can be fully populated with electronic equipment, thus optimizing utilization of cabinets, floor space, and overall utilization of real estate. By enabling the use of a smaller cooled environment footprint, less cooling is required, air turnover in that environment can be multiplies many times over, and therefore additional money and energy savings are provided since less capital investment is required to purchase air conditioning equipment, and thus no energy is needed to operate those systems and no repair costs are incurred to maintain the equipment.

This provides for an overall better indoor and outdoor environment. It is an environmentally responsible solution that has many immediate and long term benefits, and it does nothing to detract from the natural environment, but rather serves to preserve natural resources. The system reduces noise both indoors and outdoors. Utilization reduces undesirable byproducts associated with air conditioning processes, including unsightly cooling towers that must operate with poisonous chemicals added. Potential health hazards are reduced, such as development of infectious contaminants such as legionella pneumophila bacteria, or harmful pathogens such as mold, which may infect and grow in wet areas in cooling equipment and thus pose a health risk to humans such as service technicians. Utilization of the invention will reduce ozone emissions created by operation of electric motors, which contributes to smog. The systems and methods of the present invention can be utilized in any configuration that may be desirable, according to the unique layout and configuration of the facility and equipment placement within the environment. Other cooling or airflow enhancement methods are only effective or can only be utilized when equipment in the environment is placed in a particular position that in many situations is not practical, safe, or may not be desirable for operational purposes. Example forms of the system and method of the present invention can be configured in customized fashion so that any desired placement can be accommodated, and so that the beneficial operational features provided by utilization can support any number of equipment enclosures.

Other cooling and flow control devices are designed for particular location of airflow supplied to or managed by the device. The systems and methods of the present invention can provide all the same beneficial features, regardless of where the conditioned airflow is sourced, specifically in regard to whether airflow comes from below, the side, or above the invention. The systems and methods of the present invention can be configured to be installed on the either the air intake, or the air output, or both, and any other side of electronic equipment cabinets, including over or under the cabinets. By utilization of the systems and methods of the present invention, the direction of flow can be governed, and both input and output airflow through cabinets can be controlled, for recirculation, or to or from a desired location or environment. Example embodiments of the invention allow for a human, such as a service technician, to be fully inside of the system of the invention when it is installed on the air intake side of the equipment cabinets, and to service the equipment without any interruption of the beneficial properties of the invention.

Example embodiments of the invention enclose the area in front of the air intakes on the cabinets so that all of the air from the floor must flow through server cabinets, into and around every piece of equipment in the cabinet, so there will be more hot surfaces being cooled.

The effectiveness of the system and method of the present invention may be understood with reference to an example application:

72-degree Fahrenheit average air temperature in a data center environment with 20 air handlers (1 per 2000 square feet), each producing cooling air at a temperature of about 51 degrees Fahrenheit and each having a flow volume of about 12,000-cubic feet of air per minute (cfm).

10 computer cabinets arranged in each row configuration.

8 rows of 10 cabinets configured to create four "cold aisles" and 3 "hot aisles" (back side facing back side).

Cold aisles are 4 feet wide (2 floor tiles wide) so that there are ten perforated floor tiles in each cold aisle.

Average airflow volume of 320-cubic feet per minute through each perforated floor tile.

Therefore each cold air supply chamber adjacent to the equipment racks would have 3200-cubic feet of air per minute flowing into it from the subfloor, or from any other cold air source or inflow position Air temperature flowing into the cold air supply chamber is about 51-degrees.

Utilizing an example embodiment of the invention according to these parameters, the air from the chillers would only remain in the subfloor plenum area under the floor very briefly. With increased flow efficiency, the air would spend less time in the under floor environment, and so would not obtain heat from that area. Thus, if 51-degree Fahrenheit airflow were created by the air handlers, the air would be delivered quickly to the perforated tiles at or very nearly 51-degrees Fahrenheit, the air temperature of the air at the outlet of the air handlers. By enclosing the cold air supply aisle completely, including spanning the aisle with a cover such as a roof or ceiling which may be a part of the facility, or may otherwise be configured from components of the invention, and which may be configured in such a manner that no heat from the electronic equipment enclosures can be introduced into the cooling air intakes of the equipment enclosures, the cold air provided by the air handlers would create a pressure differential wherein the areas having only cold air provision will have a higher pressure as a result of inflow of the cooled air in comparison to other areas outside of the enclosed area. The areas outside of the enclosure would have lower pressure resulting from suction created by the return air intake on the air handlers by means of which cold air supplied to the cooling air supply aisle would literally be sucked through every crevice in the computer enclosures. Even in the event that there was no suction, the cooling air would have only one way to escape as the enclosure becomes mildly pressurized in comparison to the environment outside of the enclosure. Pressure is constant as a result of the inflow from the subfloor, and so the air is forced at the rate of 3200 cubic feet per minute through the computer cabinets making up the two long sides of the aisle. With 10 cabinets in each row, the air would be delivered to each cabinet, without stratification, at or very near 51-degrees Fahrenheit, and flow through each cabinet would exceed 150 cfm. As a result of increased flow rate and improved cooling performance, the equipment would operate at a lower temperature. Air passing through the equipment would not pick up so much heat, and so cooling requirements could be reduced to offset increased equipment population.

More importantly, the heat retained by operating equipment would be cut substantially. In fact, it is possible to operate the chillers at a much reduced temperature differential. This can save exponentially on power and maintenance, as well as capital equipment costs. As an example, a data center might elect to operate chillers at 68-degrees yet still ensure that the air flowing into the electronic equipment was actually much colder than the previous 72-degrees obtained at the cabinet intake without the system and method of the present invention. Cost of chilling the air would be reduced by eliminating the expense of the additional energy required to chill the air another 17-degrees. The temperature within racks can be 20 or more degrees Fahrenheit cooler.

Potential benefits from example embodiments of the invention include:

Chiller system operation would be cut by more than 50%.

Compressor and cooling tower use also would be reduced.

Expensive real estate could be utilized to optimum capacity.

Cabinets could be filled or "populated" to maximum capacity without thermal issues commonly associated with high-density installations.

Facilities that would otherwise not be able to operate and cool modern communications and data equipment would be now able to utilize modern electronic equipment without thermal component failures A basis would be provided for uptime confidence, and would provide a basis for decision-making and scalability planning that would otherwise not be possible. Increased system availability and operational performance are directly attributable to utilization of the method.

Typical data centers have cabinets filled to less than half capacity. This means that real estate expenses, the structure costing US$1000-per square foot to build, besides land and infrastructure costs, could be reduced also. A typical 40,000 square foot data center may use more than US$1.5 million in electricity in a year. Often about half of the total energy utilized, or US$750,000 worth of energy is utilized for operation of inefficient cooling methods and systems. That equates to US$18.75-per square foot per year for cooling alone. Appropriately applying representative examples of the system and method of the present invention, the savings become exponential, so that the same facility will spend less than US$5.00 per square foot for cooling each year, at current energy prices. The system and method of the present invention may instantly contribute to cash saved in cooling. Savings for such a typical facility may exceed $400,000 per year, at current energy cost rates, and would provide better cooling too.

Lower overall power consumption also means that backup and auxiliary power systems (generators) investments can also be minimized. Battery backup systems must be charged constantly, generators must be operated regularly to provide lubrication to moving parts and to clear fuel and exhaust systems. Generators commonly utilize expensive diesel fuel, gasoline, or natural gas as fuel. Batteries in uninterruptible power supply battery arrays need to be replaced after the useful life is spent. Improper disposal may cause toxic lead to be distributed to water bodies. All batteries release gas during charging. If batteries are nearing the end of their useful life, overcharging can occur and the batteries will overheat, releasing toxic vapors which are hazardous to the facility, electronic equipment, and personnel. Representative embodiments of the present invention can minimize the requirement for these systems, resulting in another potential money and energy savings advantage.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

DETAILED DESCRIPTION OF EXAMPLE EMBODIMENTS

Figure 1A:
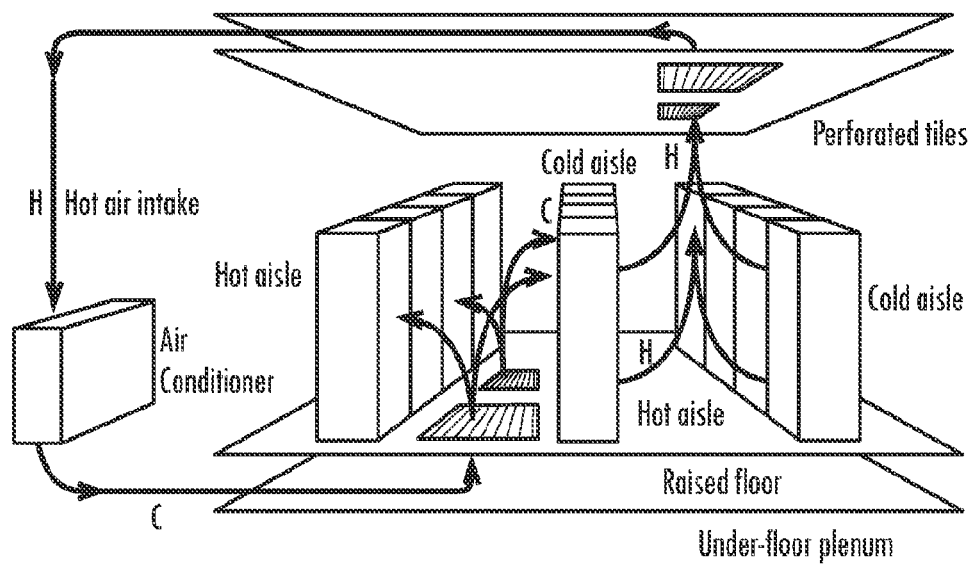
FIGS. 1a and 1b show the theoretical idealized operation, and the practical real-world actual operation, respectively, which commonly result from previously known cooling systems and methods.
Figure 1B:
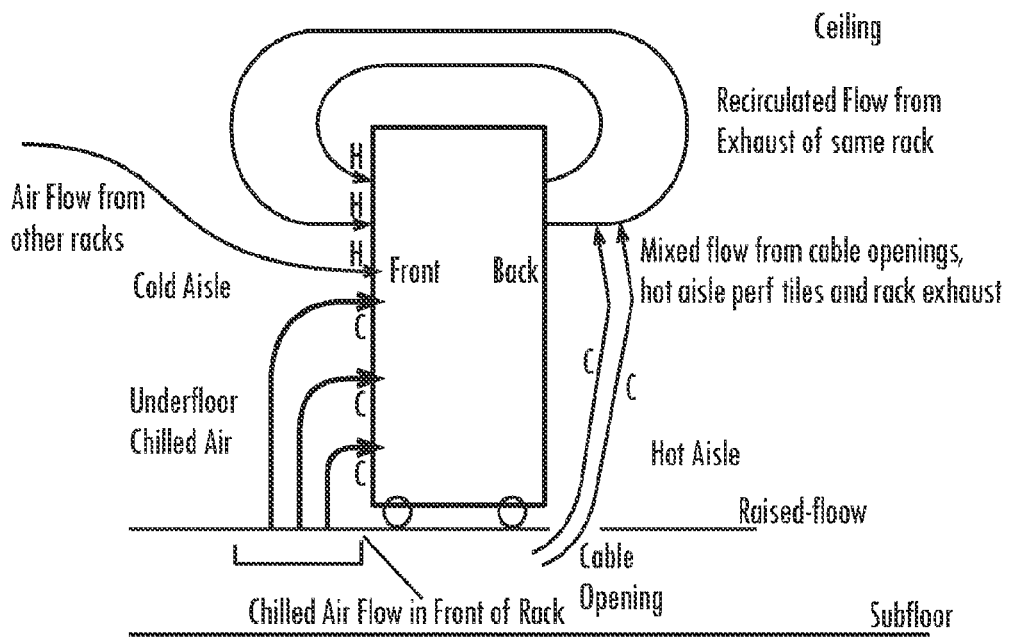

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Example forms of the system and method of the present invention enable greatly reducing the amount of energy required to adequately cool heat sensitive electronic equipment in computer data center and telecommunications environments where heat generating electronic equipment is installed. The electronic equipment is typically installed in equipment cabinets called racks, or enclosures. Cooled air is supplied from specialized air conditioning systems that may provide air to cool the equipment by a number of delivery means. A common method for distributing cooling air is utilization of an elevated flooring system called an access floor system. The floor is elevated upon pedestals that may or may not be joined by stringers. The stanchions and stringers support tiles made from any number of structurally appropriate materials. The tiles are about 1 inch thick and otherwise 2-feet wide and 2-feet long. The air conditioning system provides cooled airflow to the area underneath the flooring system with the removable tiles. Where cooling air is desired, a special floor panel is installed that may have any number of ventilation openings, for instance drilled, or louvered. The cold air flows from the area underneath the elevated floor called the subfloor. The entire subfloor area serves as a delivery plenum providing cooling air to various locations, and so it is commonly referred to as the subfloor plenum. In previously known systems, once the cooled air flows out of the perforated ventilation tile to the above floor environment, the cooled air begins to immediately mix with warmer air in the common data center environment, and so the air is less useful for cooling as the diluted cooling air is dispersed into the generally much warmer air in the above floor environment.

Example embodiments of the invention reduce the size of the overall cooling air supply plenum through which cooling air is provided to cool the heat producing electronic equipment. Currently utilized cooling methods most commonly use air conditioning equipment to cool the entire data center environment in which the sensitive equipment is operating. Usually the equipment is located inside of rack enclosures or other type of cabinet commonly used to hold equipment in these environments. The rack enclosures create dense heat sources within an otherwise cooler environment. The racks are incapable of obtaining adequate heat dissipation by means of radiant distribution. Core temperatures within the enclosure may reach temperatures high enough to vaporize metals, which may also cause system component failure The commonly utilized method of cooling the entire data center environment is intended to limit obstruction of available cooling airflow within the environment. Since the whole room shares the same air supply, cooling air availability is commonly believed to be equivalent throughout the environment. Unfortunately and unexpectedly, these previously accepted concepts regarding cooling have now been discovered to be flawed, inefficient, and expensive, since (i) actual airflow has been found to not follow the idealized airflow patterns previously envisioned; and (ii) the overall volume of air to be cooled is very great, and maintaining such a volume of air at an adequately low temperature requires excessive use of electrical energy. Previously known cooling methods do not prevent mixing of the supplied filtered, cooled, and otherwise conditioned air with the heated air exhausted from heat generating equipment. Example embodiments of the invention, by contrast, utilize partitions that can be configured to completely isolate the cooling air intake of the equipment cabinets so that the cooling air supplied under pressure from the air conditioning machines is prevented from mixing with any warm air, and is then forced in very high volume through the equipment requiring cooling.

Without adequate cooling, computers may fail without warning due to excessive heat. Many data center and telecommunications facilities are experiencing problems with equipment failures resulting from thermal failure. This is especially true in the case of facilities where newer, high-speed computers operate at much higher temperatures than older systems. Example embodiments of the present invention exponentially increase the amount of cooling air delivered to hot surfaces of electronic equipment. Suction from the air-conditioning system intakes depressurizes the area outside of the cold-air-only supply chamber of the present invention. This reduced pressure works to vacuum the cooling airflow from the created cold-air-only plenum chamber of the present invention. Thus the powerful motors on the air conditioning systems both pressurize the isolated cooling air plenum, while at the same time depressurizing the separated warmed air return plenum. No existing method utilizes these powerful motors in such a manner.

In example embodiments of the present invention, any portion up to the full output flow of the air conditioners can be supplied directly to the cooling air intake of computer equipment regardless of location in the data center. Data centers on average use a large percentage of the overall energy used to cool the heat producing equipment that consumes the balance of the energy. Current methods of cooling allow warm air to mix with cooling air because the entire data center environment is used as a conduit to supply cool air to the computer equipment. In a typical environment, there is no method for ensuring that cooling flows through computer equipment once it has traveled from the air chiller to the above floor environment.

The present invention minimizes the overall volume of the cooling air supply plenum, so that the cooling air flows quickly from the chiller to the cooled equipment. Air-cooling systems for computer areas have powerful motors capable of producing massive flow exceeding 10,000 cubic feet of filtered, chilled air each minute. The input side of the cooled equipment serves as a wall of the enclosure, and the enclosure is in direct communication with the output of the air conditioning system by means of a plenum. The air conditioning units pull intake air from the common room environment, which is partitioned from the cooling air supply system by my invention. This causes a pressure differential that is in no way uncomfortable to personnel, but that will greatly increase flow through the computer cabinets as a result of the vacuum effect caused by lower pressure on the return plenum supplying intake air to the air conditioning systems.

The combination of elevated pressure in the cooling air supply chamber adjacent to the racks and high volume flow of the cooling air supplied to electronic equipment is magnified by suction created by the air conditioners drawing air from the output side of the computer equipment. The temperature of cooling air supplied to computers is as low as can be obtained at all times because the invention prevents warm air from mixing with the cooling air supplied by the air conditioning systems. This means that fewer air handlers are required, thus cooling equipment and energy costs are greatly reduced. Because of increased throughput of cooling air, the computer systems can be cooled adequately with cooling air of a higher temperature than would otherwise be possible.

Since the volume of air flowing through computer servers is multiplied, the air is not as warm when exiting the computer equipment. This means that the input air returning to the air conditioning systems will not require as much energy to cool to an acceptable output temperature. Most electronic equipment components may have one or more small axial cooling fans of a few inches in diameter that move a small volume of air across a few of the heat generating surfaces within the equipment. The present invention will allow facilities that have adequate electrical power to operate the newest high-density servers that could otherwise not be cooled sufficiently using existing cooling methods. The present invention also eliminates cooling problems caused by air stratification in which the air separates into various layers of different temperatures. When the air accumulates into temperature layers, the denser cooling air is always on the bottom, yet, the hot surfaces are often much higher in the environment than the cooling air can possibly be delivered. As a result of this problem, data centers do not fill computer enclosures to capacity, since the equipment near the top of the enclosure would fail due to poor cooling.

Data centers are expensive structures to build and maintain. Unlike existing cooling methods, the present invention will enable the cool air delivered from the air handlers to be supplied directly to any electronic equipment in any area of the data center or controlled environment and regardless of elevation within the equipment enclosures. The present invention will allow enclosures to be filled completely and can provide the same temperature and flow of cooling air to every server installed in enclosure. Installation of example systems incorporating the present invention is very fast, and can preferably be accomplished by one person without any interruption of computer operations. The present invention typically does not require any changes to existing facility infrastructure, requires no additional plumbing, does not require additional sources of electricity or additional consumption of energy, and generally does not necessitate load bearing structures to be reinforced.

Unlike some existing systems, with the present invention, there is typically no need to shut down, or remount the servers in a different type of enclosure. This means that there is no interruption of any data center operations during installation. Electrical requirements will be reduced immediately after the present invention is installed. By applying the present invention to all computer equipment requiring cooling air from the air conditioners, the overall cooling performance will actually increase as a result of increased pressure and flow being supplied to all equipment at the same time. As a result, overall room temperature will be reduced, even though the temperature of the cooling air supplied to provide cooling could be increased. Thus, the energy savings are compounded.

Example embodiments of the present invention cost less than other cooling solutions, and can be deployed very quickly. Return on investment of the cost to apply the present invention comes in several forms: uptime reliability because of reduced failures, greatly reduced cooling energy costs, better utilization of data center space, and reduced costs to populate the environment with equipment, and reduced cost of air conditioning equipment and maintenance.

Example embodiments of the present invention can also be installed where no other system can, because it preferably comprises a zero-clearance disappearing door system that also serves as a wall. This feature enables utilization for any machine position or configuration. Unlike other cooling systems available, the system of the present invention does not require the computer systems to be in an aisle, or even a row configuration. It can be utilized with any brand of computer equipment, and any mix of computer equipment or enclosures of various heights and from different manufacturers.

Example embodiments of the present invention can be utilized with any configuration or layout of computer equipment, from a single computer to any size mix of equipment.

Another feature of the present invention is that in example embodiments, it can be utilized to provide physical access security. Federal law requires many data center facilities such as those of banks, insurance companies, credit institutions, and others to abide by strict access security protocols. Example embodiments of the present invention can be installed to provide cooling, or for other purposes in the environment, including elsewhere in the environment to provide separation or access security or both.

Example embodiments of the present invention can be utilized in various different configurations so that the same results can be achieved in data centers of any configuration, regardless of whether the cooling air is supplied from a sub-floor plenum, or an overhead supply, or from the side. A cooling system according to an example embodiment of the invention preferably has a frame made of aluminum or other metal or structural material, suitable for use as a frame to support the panels and disappearing walls or doors. The frame is preferably fitted with panels, doors, or other partition components of any material suitable for the desired use or installation situation. Doors and disappearing walls can optionally be fitted with security locks or other desired security devices, including specialized identification matching devices.

Figure 2:
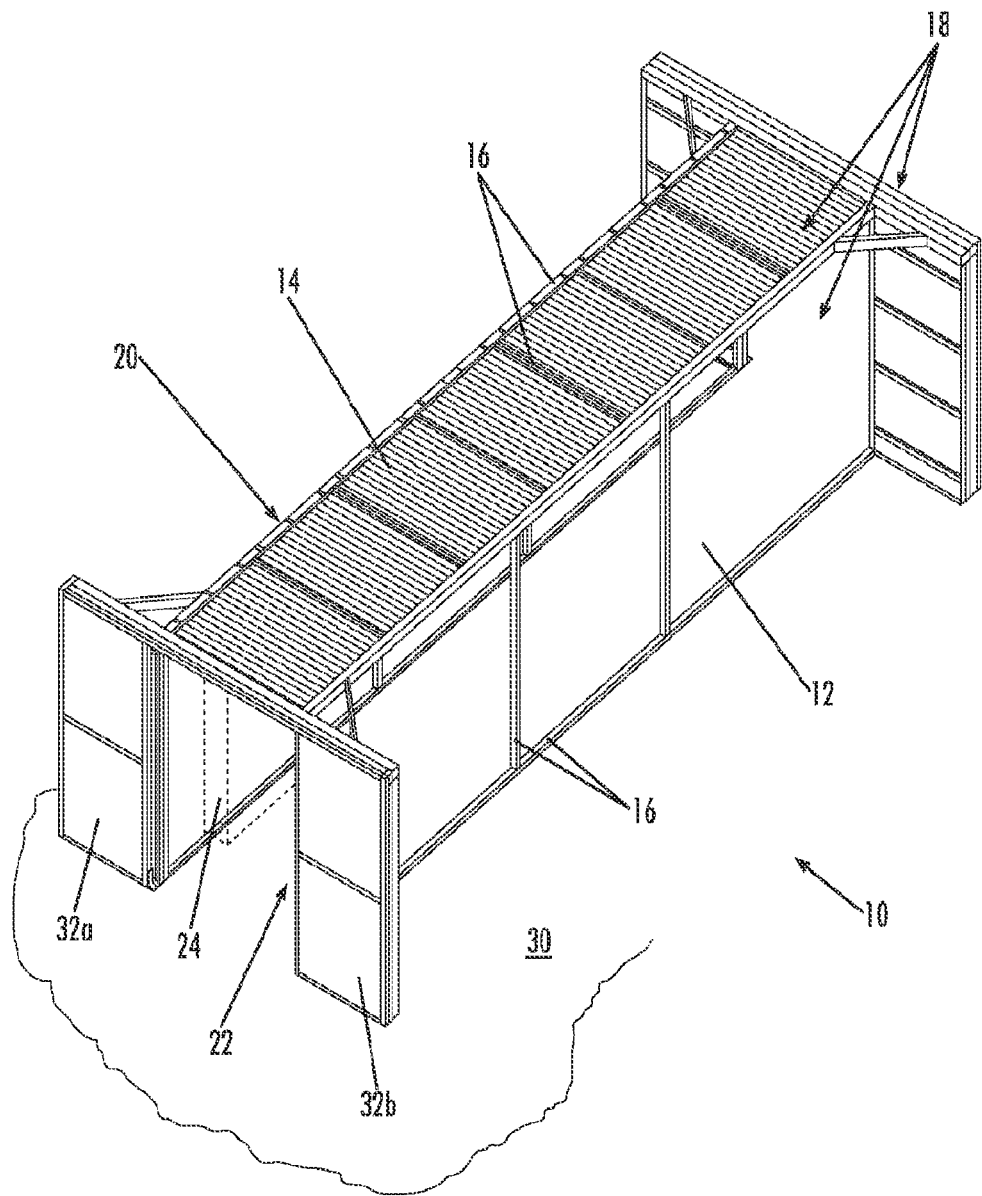
FIG. 2 is a perspective view of an example form of a cooling system according to the present invention.

FIG. 2 shows a perspective view of a representative example of a cooling system 10 for carrying out the methods of the present invention. One or more sidewall panels 12, and one or more roof panels 14 are preferably mounted to one or more frame elements 16 to form one or more partitions 18, defining a substantially airtight enclosure 20 surrounding an enclosed space or chamber 22, within which electronic computer and/or telecom equipment 24 is installed. As used herein, an "airtight" enclosure refers to an enclosure that is sufficiently isolated from an external environment to result in a pressure differential between the internal contained volume of the enclosure (typically the higher pressure region) and the external environment (typically the lower pressure region) in normal operation, and does not exclude an enclosure having gaps or openings for cable access, attachments, fasteners, fire-suppression access, gaps at doors and other moving parts, and the like. The floor 30 upon which the enclosure is supported may be a raised access floor, optionally defining a cooling air and/or cable plenum there beneath, or may be a standard structural floor of concrete or other known form. In example embodiments, the framing elements 16 comprise prefabricated quick-connect, reconfigurable extrusions of aluminum or other metal, such as the T-Slot™, 80/20™, Octanorm™ or other component system, and optionally include gaskets or seal surfaces for airtight engagement with the panels and to prevent vibration. The sidewall panels 12 and roof panels 14 preferably comprise substantially rigid and air impermeable planar or curved panels of acrylic, glass, or other material, and may be transparent, translucent or opaque, and optionally are provided with a coating or other means of static electricity dissipation. One or more access doors 32 allow personnel and/or equipment ingress and egress to and from the enclosed chamber 22 when opened, and provide a substantially airtight enclosure when closed. In example embodiments, the access doors 32 comprise low profile "elevator style" sliding pocket doors, pull-down flexible closures, accordion-style collapsible panels, swing door, or flexible, or stretch materials. Locks are optionally provided on the access doors for security and access control, and may include keyed, keycard and/or biometric (fingerprint, retinal scan, etc.) access limitation. In the depicted embodiment, the enclosure 20 forms a generally rectangular elongate chamber or hallway having access doors at both ends thereof, first and second opposed sidewalls extending lengthwise from end to end, and a roof extending from end to end between the first and second sidewalls.

Figure 3:
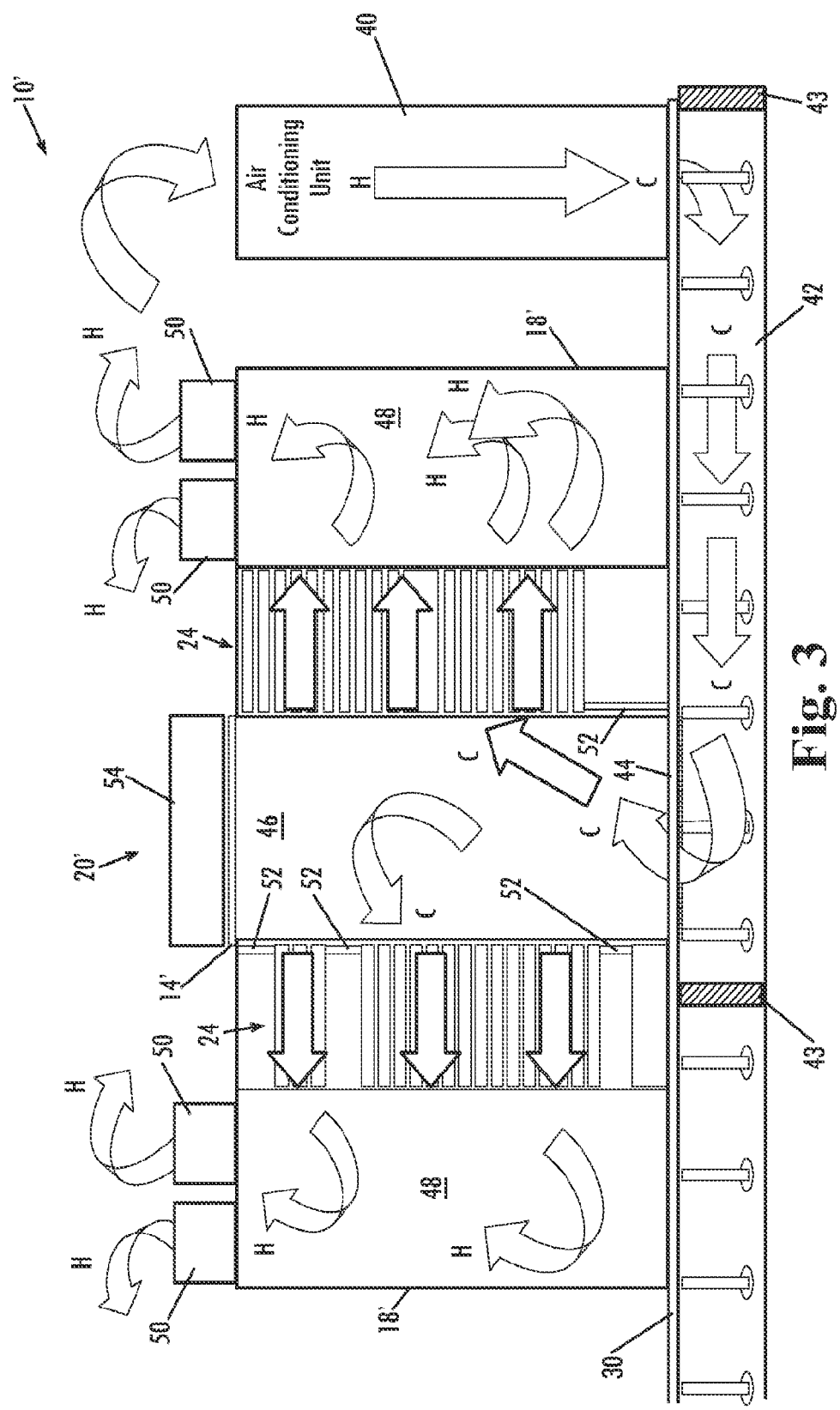
FIG. 3 is a cross-sectional view and airflow diagram of an example form of a cooling system according to the present invention.

FIG. 3 shows a side view of a cooling system 10' and enclosure 20' according to a further representative form of the invention. Cold air C is delivered from a chiller or air-conditioning unit 40 to a cooling air plenum 42 beneath a raised access floor 30, through a perforated floor tile 44, into a cooling air delivery chamber 46. The cooling air C is delivered from the cooling air delivery chamber 46 through one or more arrays or racks of electronic equipment 24, into one or more warm and air chambers 48. As the cooling air passes along the electronic components, heat is transferred from the components to the cooling air, effectively cooling the electronic components and heating the air. The cooling air C is delivered under the influence of positive pressure from the cool air delivery side, as from a fan or blower of the air-conditioning unit 40, and/or negative pressure from the warm air discharge side, as from one or more high-flow fans 50, such as, but not limited to, a scroll fan or squirrel cage fan system, discharging air from the warm air chamber 48. The optional provision of discharge fans 50 advantageously relieves back-pressure, prevents fluid cavitation within the system, and ensures positively controlled airflow throughout the enclosure at all times. Cooling air C is substantially restricted from exiting the cooling air delivery chamber 46, except through the desired cooling airflow channels between adjacent electronic equipment components 24, by means of the substantially airtight enclosure 20', and infill or blanking panels 52 that prevent air from escaping through empty spaces where no electronic components are installed. Heated air H is discharged from the warm air chamber 48, into the environment outside of the enclosure 20', and is prevented from mixing with the cooling air C by the substantially airtight nature of the enclosure. In alternate embodiments, the heated air H is collected in a return plenum for recycling back to the chiller or for external discharge, and the provision of a warm air discharge chamber 48 may optionally be omitted. A roof panel or cover portion 14' of the enclosure 20' is optionally equipped with one or more accessories 54, which may include: lighting, emergency cooling systems, fire suppression systems, fire or smoke detection sensors, video surveillance gear, and/or other equipment or fixtures. Optionally, one or more subfloor partitions 43 are provided, for example along four sides defining a rectangular array, to segregate a reduced volume subfloor cooling air delivery plenum from the overall subfloor space, to further reduce the volume of air required to be cooled and thereby increase the flow velocity or flow rate of cooling air through the entire cold air supply plenum and cold air supply chamber, thus increasing the rate of cooling air turnover delivered.

Figure 4:
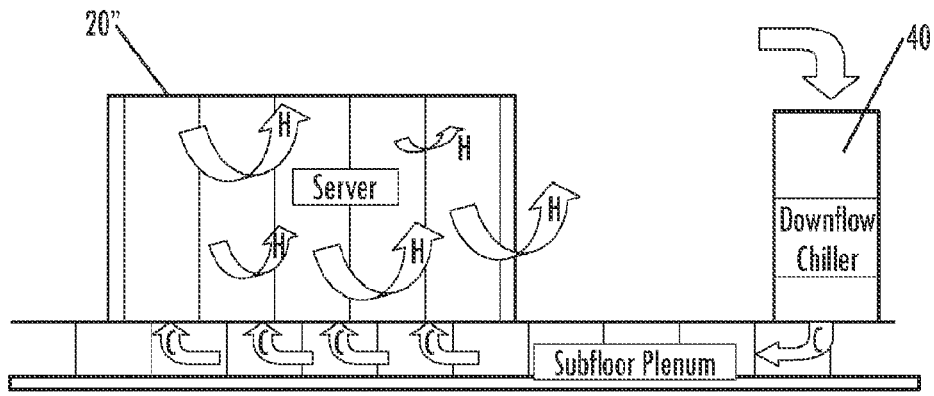
FIG. 4 is a partial cross-sectional view and airflow diagram of another example form of a cooling system according to the present invention.
Figure 5:
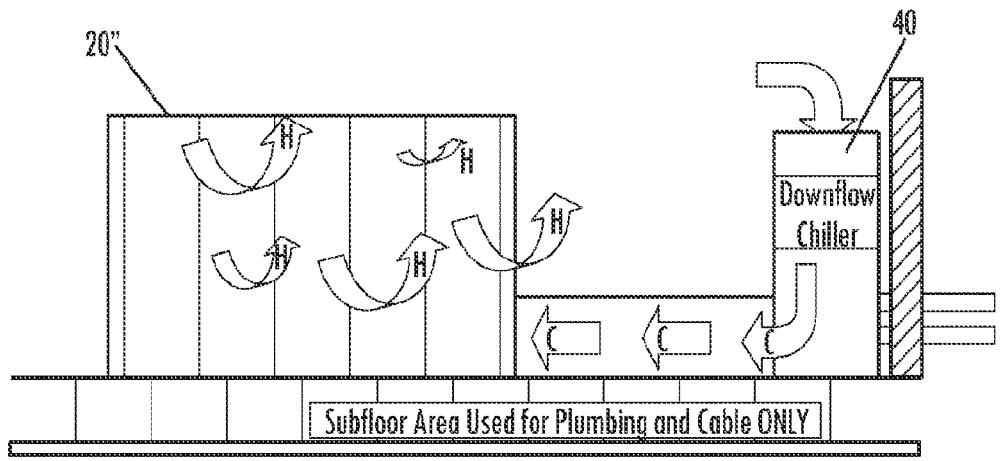
FIG. 5 is a partial cross-sectional view and airflow diagram of another example form of a cooling system according to the present invention.
Figure 6:
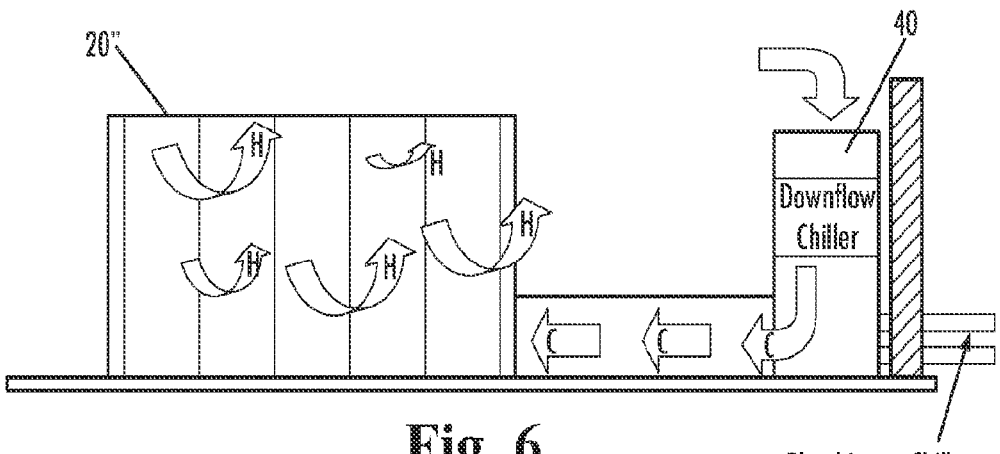
FIG. 6 is a partial cross-sectional view and airflow diagram of another example form of a cooling system according to the present invention.
Figure 7:
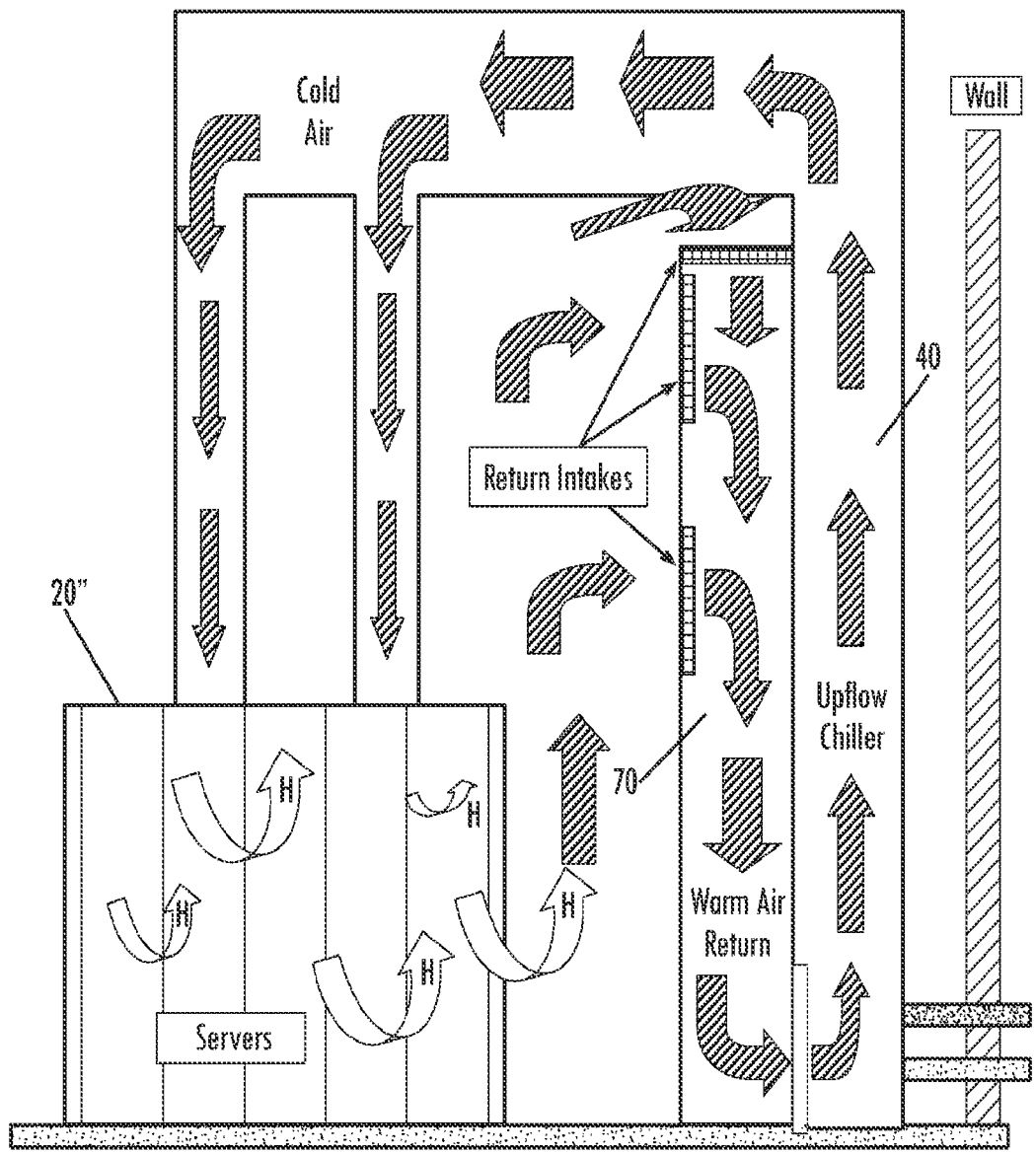
FIG. 7 is a partial cross-sectional view and airflow diagram of another example form of a cooling system according to the present invention.
Figure 8:
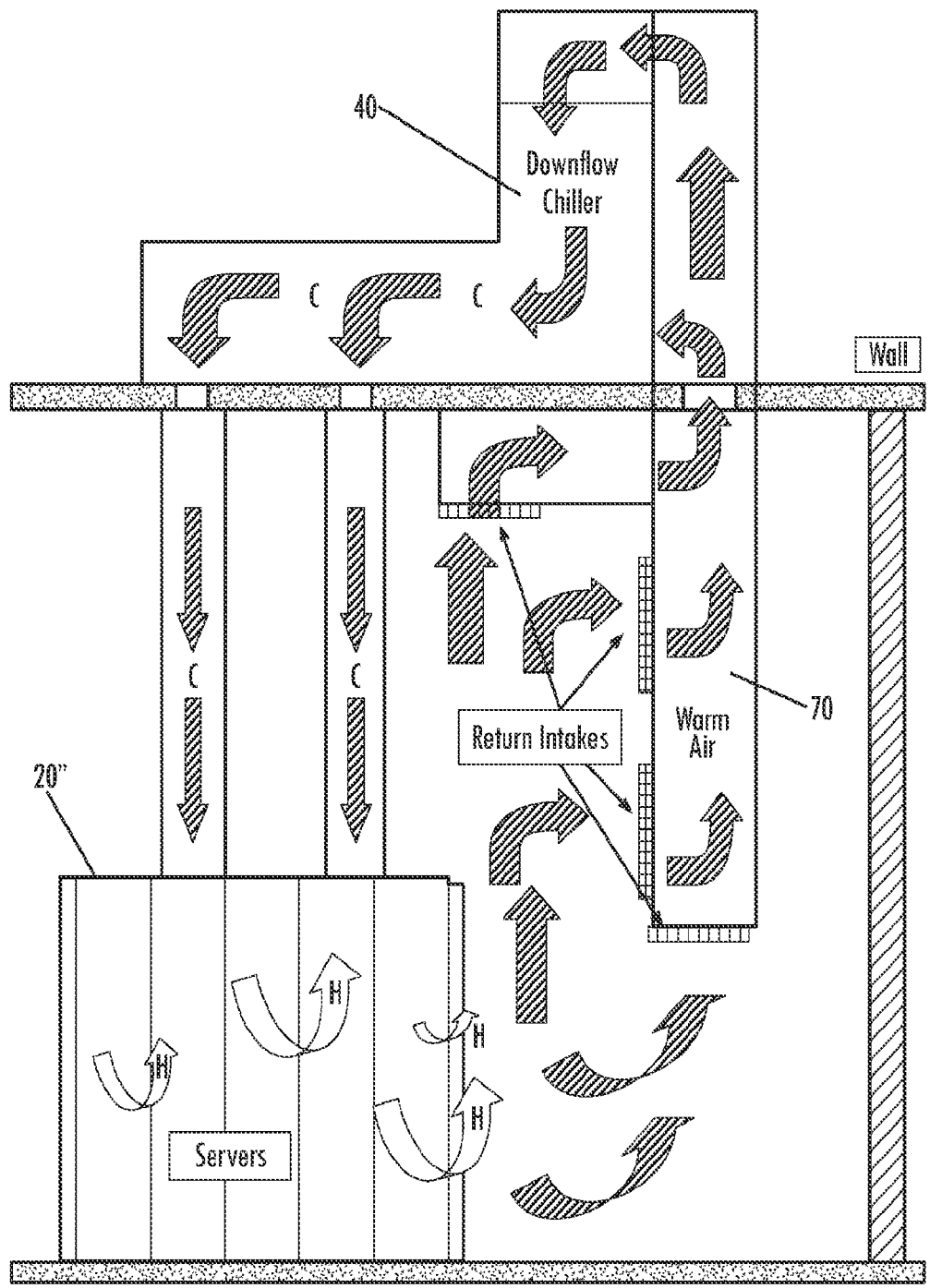
FIG. 8 is a partial cross-sectional view and airflow diagram of another example form of a cooling system according to the present invention.

FIGS. 4-8 show various alternate embodiments of cooling systems according to further examples of the present invention. In each example, cold air C is delivered from a chiller or air-conditioning unit 40 to an enclosure 20" via a cooling air plenum. In the embodiments of FIGS. 4-6, the cooling air C is delivered to the bottom of the enclosure from a down-flow chiller, while in the embodiments of FIGS. 7 and 8 the cooling air is delivered to the top of the enclosure, and the system sits directly on the structural floor. In the embodiment of FIG. 4, the cooling air delivery plenum is the subfloor plenum of a raised access floor; whereas in the embodiment of FIG. 5, the cooling air delivery plenum is positioned above a raised access floor; and in the embodiment of FIG. 6, the cooling air delivery plenum is positioned above a structural concrete floor. In the embodiments of FIGS. 7 and 8, the warm air H discharged from the enclosure 20 is collected in a warm air return plenum 70, and recycled through the chiller. In the embodiment of FIG. 7 the chiller is an up-flow chiller housed on the same floor as the enclosure; whereas in the embodiment of FIG. 8, a down flow chiller is housed on the floor above the enclosure.

Figure 9:
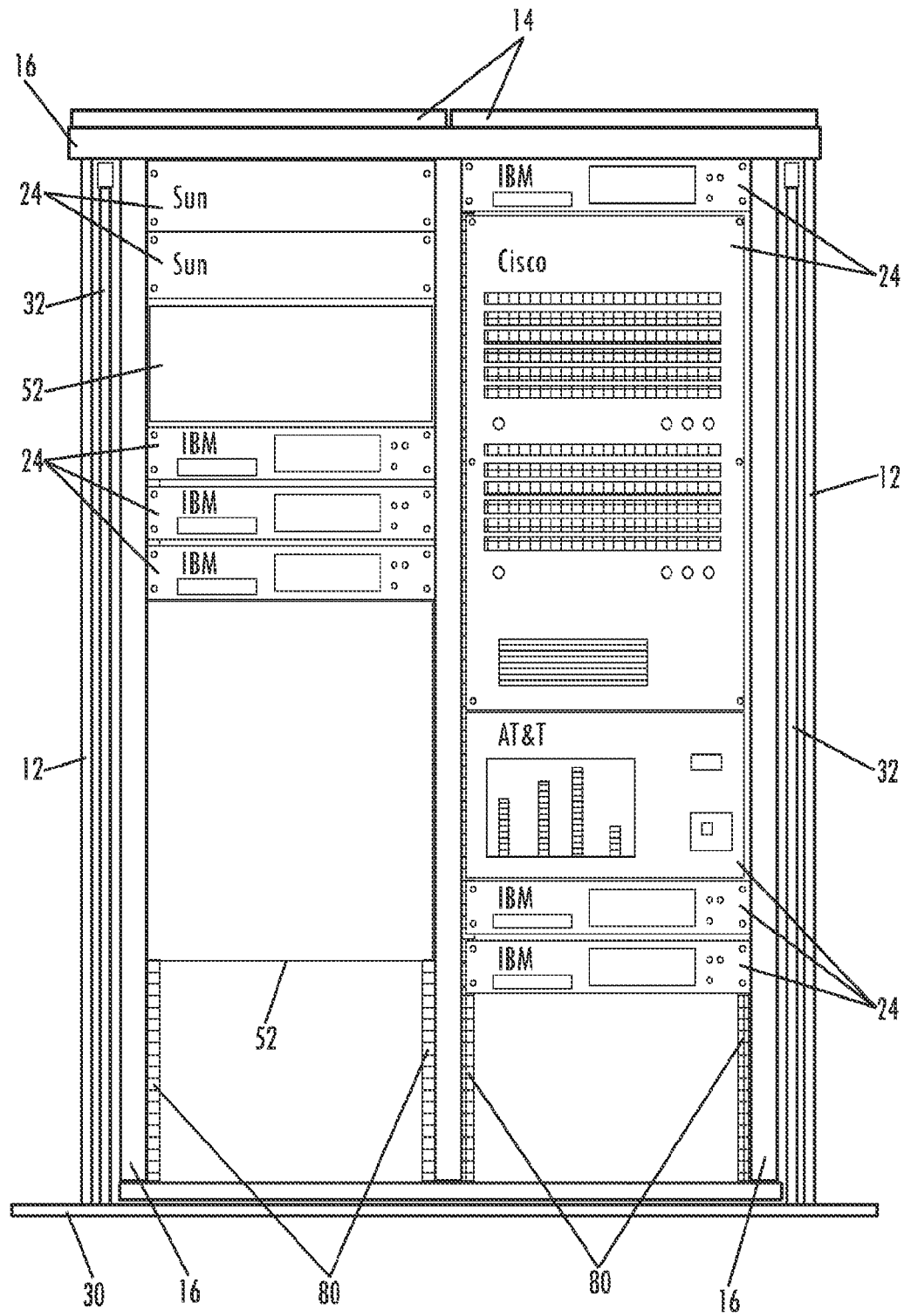
FIG. 9 is a detailed front view, in partial cross-section, of another example form of a cooling system according to the present invention, showing a representative installation of electronic components therein.

FIG. 9 shows a detailed view of a cooling system enclosure according to another representative form of the invention. Side panels 12 and top panels 14 are mounted on framing members or supports 16, and sliding pocket doors 32 are provided to form a generally airtight enclosure over a support floor 30. Electronic components 24 and blanking panels 52 are secured by mounting screws, built-in retaining brackets, or other fasteners, to mounting rails 80 attached to vertical framing members 16 of the enclosure. Lower spaces of the left and right-hand side equipment racks are left open in the drawing figure to more clearly show the mounting rails, but in practice would preferably be filled with electronic components 24 and/or blanking panels 52 to control airflow as desired through the components. Although a dual-rack system is shown (i.e., a left-hand equipment array and a right-hand equipment array), it will be understood that the system and method of the present invention are compatible with single-rack systems, and with multi-rack systems of virtually any configuration or disposition (including racks of different heights, spacing or shapes). Equipment racks need not be arranged in parallel rows to form alternating hot/cold aisles, but can be arranged in any location, format and/or orientation within the controlled environment. Also, the enclosure of the cooling system of the present invention can be installed surrounding one or more existing equipment racks of virtually any manufacturer or design; or alternatively, the electronic components can be mounted directly to mounting rails or other components of the enclosure, thereby eliminating the need for changing electronic equipment installation from existing racks to a particular rack enclosure, or any other third-party racks.

In some applications, equipment may be positioned in a room with an exposed structural ceiling. In representative applications, the system of the present invention may utilize the existing structural ceiling as the top of the cold chamber. (Some facilities have very low clearance as a result of the access flooring system boosting the floor height, so that there is no room for a suspended ceiling system.)

In representative forms of the invention, the enclosure of the cooling system includes sufficient enclosed interior space to contain the electronic components to be cooled, along with portions or all of any racks that the components are mounted on, as well as sufficient personnel access space on the front and/or back sides of the components for anticipated maintenance or monitoring. Optionally, access to the enclosure of the cooling system is provided through an airlock arrangement having first and second doors or closures that are opened and closed in sequence to minimize loss of pressurized cooling air from the enclosure as personnel enter and exit.

The enclosure of the present invention can optionally be utilized to function as an enclosed conduit for electrical wiring, and fiber optic networking or traditional hard wire networking cabling, so that the wires and cabling are protected from damage and can be neatly arranged to avoid damage, accidental disconnects, shorting of electrical wires, and fires. Panels of the enclosure can optionally also be utilized to create security partitions or provide physical isolation of specific equipment, and further can optionally comprise bulletproof components that also allow for complete visible observation either into or out of the enclosure. The framing and panels of the system can optionally be infinitely reconfigured without dismantling the entire structure, and can be expanded or changed to provide room for additional equipment, or made smaller to accommodate removal of equipment. Seismic and/or positional bracing support of all equipment can optionally be provided by appropriate configuration of the framing and panels of the system, for support in a seismic event or in the event of sway in high-rise facilities. The enclosure may provide fire suppression control directly to the computer equipment, without dispersing fire suppression materials throughout the external environment. The enclosure may be installed and assembled over existing equipment without disconnection or disruption of operation.

Example embodiments of the present invention are suitable for use in whole or in part in other industries as well, including drug and pharmaceutical manufacturing and production and laboratory areas and will serve to prevent contaminants from entering the area where maintaining high quality filtered air is crucial. The system will also be useful in microelectronics manufacturing environments, aerospace, and medical partitioning environments for research or patient care.

The structural frame of the unit can be configured to serve as a brace to support computer enclosures and thus serve as a seismic bracing mechanism. Various components of the invention can be utilized alone, or in combination with other components to bridge adjacent rows of computer equipment so that a the bridge, being very strong, can be utilized to support a utility tray into which cables or other infrastructure hardware can be placed.

Data center facilities are noisy environments. Example embodiments of the present invention will greatly reduce the overall noise in the data center environment by acting as soundproofing enclosures. Fire is also a serious concern in data center facilities. Much investment is required to provide fire suppression in order to protect the vital computer systems and other equipment in the facility. Example embodiments of the present invention can also serve to prevent the spread of flames in the event of a fire by partitioning the various areas where the system is utilized. Example embodiments of the present invention can be configured to allow full transmission of light, or translucent, or opaque.

Because of the tremendous increase in flow volume forced through the heat producing equipment by the system and method of the present invention, the exhausted air comes out of the equipment at a lower temperature than with previously known systems, and as a result of this, the air conditioning systems do not require as much energy to cool the airflow coming from the equipment. This will greatly reduce the electrical energy needed to operate the air conditioners. Another energy saving feature of the present invention is the fact that the cooling air will not have to be provided at a temperature as low as would otherwise be provided. This adds again to the energy and cost savings. Elevated cooling air temperature, increased flow volume, and warm exhaust temperatures all serve to minimize energy consumption and cooling costs. Unlike other systems, the present invention allows for human occupation of the isolation chamber, and will prevent cooling air from escaping around or over heat producing equipment. Other cooling methods require that equipment be configured into rows or aisles. The present invention has no such requirement since the system's modular components can be configured in any manner to create partition.

While the invention has been described with reference to preferred and example embodiments, it will be understood by those skilled in the art that a variety of modifications, additions and deletions are within the scope of the invention, as defined by the following claims.

What is claimed is:

1. A cooling system for electronic equipment comprising: a substantially airtight enclosure formed within a structure, for delivering cooling air to at least one electronic component within the enclosure, the enclosure defining a first contained volume and the structure defining a second contained volume, the first contained volume being less than the second contained volume; means for delivering cooling air to the substantially airtight enclosure; and means for controlling the flow of the cooling air to the at least one electronic component within the substantially airtight enclosure, wherein the means for controlling the flow of cooling air comprises a cooling air delivery chamber comprising a first portion of the substantially airtight enclosure on one side of the at least one electronic component and two warm air chambers comprising a second portion of the substantially airtight enclosure on the opposite side of the at least one electronic component; and wherein pressure within the cooling air chamber of the substantially airtight enclosure is differential and superior to pressure within the warm air chambers; the at least one electronic component being located on each side of the cooling air delivery chamber and within the substantially airtight enclosure, and wherein the means for controlling the flow of the cooling air further comprises at least one discharge fan on each of the warm air chambers.

2. The cooling system of claim 1, further comprising a chiller or other source for generating the cooling air delivered to the substantially airtight enclosure.

3. The cooling system of claim 1, wherein the substantially airtight enclosure comprises a plurality of framing members and at least one panel attached to the framing members.

4. The cooling system of claim 3, wherein the framing members comprise quick-connect extrusions.

5. The cooling system of claim 4, wherein the quick-connect extrusions further comprise gaskets for preventing leakage of the cooling air.

6. The cooling system of claim 1, wherein the means for delivering cooling air to the substantially airtight enclosure comprises a cooling air delivery plenum.

7. The cooling system of claim 6, wherein the cooling air delivery plenum comprises a subfloor plenum and at least one perforated floor panel.

8. The cooling system of claim 7, wherein the subfloor plenum for cooling air delivery comprises a segregated portion of an overall subfloor space.

9. The cooling system of claim 6, wherein the cooling air delivery plenum delivers the cooling air to a lower portion of the substantially airtight enclosure.

10. The cooling system of claim 6, wherein the cooling air delivery plenum delivers the cooling air to a top portion of the substantially airtight enclosure.

11. The cooling system of claim 1, wherein the means for controlling the flow of the cooling air comprises a plurality of electronic components arranged in an array to define cooling airflow channels between adjacent electronic components.

12. The cooling system of claim 11, wherein the means for controlling the flow of the cooling air further comprises at least one blanking panel.

13. The cooling system of claim 11, wherein the array of electronic components are mounted on a rack.

14. The cooling system of claim 11, wherein the array of electronic components are attached to a framing member of the substantially airtight enclosure without a rack.

15. The cooling system of claim 1, wherein the at least one fan discharges air from the warm air chamber.

16. The cooling system of claim 1, further comprising at least one access point for personnel and equipment to enter into and exit from the substantially airtight enclosure.

17. A cooling system for electronic equipment comprising: a substantially airtight enclosure defining a reduced-volume interior cooled environment within a structure having a greater volume, the enclosure delivering cooling air to the electronic equipment and comprising a partition substantially inhibiting mixing of the cooling air with external air within the structure but external of the substantially airtight enclosure; and means for controlling the delivery of the cooling air through the reduced-volume cooled environment to maintain flow paths of the cooling air along surface areas heated by the electronic equipment, the means for controlling the delivery of the cooling air comprising an air plenum, a cooling air delivery chamber located on one side of each of two arrays containing the electronic equipment, and two warm air chambers located on the other, opposite side of each of the two arrays, each warm air chamber comprising at least one discharge fan, the at least one discharge fan facilitating airflow through the reduced-volume interior cooled environment.

18. The cooling system of claim 17, further comprising an air chiller.

19. The cooling system of claim 17, wherein the means for controlling the delivery of cooling air through the reduced-volume cooled environment comprises a plurality of electronic components arranged in the arrays to define cooling airflow channels between adjacent electronic components.

20. The cooling system of claim 19, wherein the means for controlling the flow of the cooling air further comprises at least one blanking panel.

21. A method of reducing the consumption of energy used to cool electronic equipment said method comprising: providing an enclosure within a structure containing the electronic equipment, the enclosure defining a reduced volume cooled environment relative to the contained volume of the structure; delivering cooling air to a cooling air delivery chamber between two racks in the reduced volume cooled environment via an air plenum; generating a positive pressure differential from a first side of each rack to a second, opposite side of each rack via at least one discharge fan on a respective warm air chamber at the second side of each rack to create a flow of the cooling air across a surface of the electronic equipment; and controlling the delivery of cooling air from the reduced volume cooled environment to the electronic equipment by partitioning the cooling air from a higher temperature air mass within the structure but external of the enclosure to prevent dilution of the cooling air by the higher temperature air mass.

22. The method of claim 21, further comprising substantially inhibiting mixing of external air with the cooling airflow delivered to the reduced volume cooled environment.

23. A cooling system for electronic equipment comprising: a substantially airtight enclosure within a structure, for delivering cooling air to at least one electronic component, the enclosure defining a first contained volume and the structure defining a second contained volume, the first contained volume being less than the second contained volume; a cooling air delivery plenum for delivering cooling air to a cooling air delivery chamber located on a first side of two arrays which contain the electronic equipment in the substantially airtight enclosure, the substantially airtight enclosure preventing dilution of the cooling air by warmer air within the structure but external of the enclosure; and at least one discharge fan on each of two warm air chambers of the enclosure for controlling the flow of the cooling air to the at least one electronic component within each array of the substantially airtight enclosure, each warm air chamber located on a second, opposite, side of the two arrays which contain the electronic equipment.

24. A cooling system for electronic equipment contained in racks comprising: a substantially airtight enclosure for delivering cooling air to two racks; means for delivering cooling air to the substantially airtight enclosure; and means for controlling the flow of the cooling air to the two racks within the substantially airtight enclosure, wherein the means for controlling the flow of cooling air comprises a cooling air delivery chamber between the two racks and two warm air chambers each including at least one discharge fan thereon, on the opposite sides of the two racks, wherein pressure within the cooling air chamber of the substantially airtight enclosure is differential and superior to pressure within the warm air chambers, and wherein volume and velocity of air cooling the two racks is increased, the cooling air delivery chamber, the two racks, and the warm air chamber all being within the substantially airtight enclosure; wherein the substantially airtight enclosure comprises a plurality of framing members and at least one panel attached to the framing members, wherein the framing members comprise quick-connect extrusions, and wherein the quick-connect extrusions further comprise gaskets for preventing leakage of the cooling air.

25. A cooling system for electronic equipment comprising: a substantially airtight enclosure defining a reduced-volume interior cooled environment within a structure having a greater volume, the enclosure delivering cooling air to the electronic equipment and comprising a partition substantially inhibiting mixing of the cooling air with external air within the structure but external of the substantially airtight enclosure; and means for controlling the delivery of the cooling air through the reduced-volume cooled environment to maintain flow paths of the cooling air along surface areas heated by the electronic equipment, the means for controlling the delivery of the cooling air comprising an air plenum, a cooling air delivery chamber located on one side of each of two arrays containing the electronic equipment, at least one blanking panel and two warm air chambers located on the other, opposite side of each of the two arrays, each warm air chamber comprising at least one discharge fan, the at least one discharge fan facilitating airflow through the reduced-volume interior cooled environment.

* * * * *